(12) United States Patent
Wadhwa et al.

(10) Patent No.: US 8,742,815 B2
(45) Date of Patent: Jun. 3, 2014

(54) TEMPERATURE-INDEPENDENT OSCILLATORS AND DELAY ELEMENTS

(75) Inventors: Sameer Wadhwa, San Diego, CA (US); Marzio Pedrali-Noy, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 13/527,908

(22) Filed: Jun. 20, 2012

(65) Prior Publication Data

US 2013/0342256 A1 Dec. 26, 2013

(51) Int. Cl.
*H03H 11/26* (2006.01)

(52) U.S. Cl.
USPC ............ 327/262; 327/277; 327/283; 327/290

(58) Field of Classification Search
USPC ......... 327/262, 269–272, 274, 276–278, 280, 327/281, 283–285, 287, 288, 290; 331/65, 331/66
See application file for complete search history.

(56) References Cited

U.S. PATENT DOCUMENTS

| | | | |
|---|---|---|---|
| 4,641,048 A | | 2/1987 | Pollock |
| 4,717,891 A | | 1/1988 | Ichise et al. |
| 5,241,286 A | * | 8/1993 | Mirow ...................... 331/108 B |
| 5,687,201 A | | 11/1997 | McClellan et al. |
| 5,783,956 A | | 7/1998 | Ooishi |
| 5,808,505 A | * | 9/1998 | Tsukada ....................... 327/536 |
| 6,034,557 A | * | 3/2000 | Schultz et al. ................ 327/276 |
| 6,163,195 A | * | 12/2000 | Jefferson ...................... 327/262 |
| 6,476,656 B2 | * | 11/2002 | Dally et al. ................... 327/276 |
| 6,509,774 B2 | * | 1/2003 | Park et al. ..................... 327/262 |
| 6,633,189 B1 | * | 10/2003 | Gradinariu et al. ........... 327/262 |
| 6,724,338 B1 | * | 4/2004 | Min et al. ...................... 341/155 |
| 6,762,634 B1 | | 7/2004 | Hattori |
| 6,803,803 B1 | * | 10/2004 | Starr et al. .................... 327/378 |
| 7,002,414 B2 | | 2/2006 | Chang et al. |
| 7,154,324 B1 | * | 12/2006 | Maangat et al. .............. 327/288 |
| 7,266,170 B2 | | 9/2007 | Matsunami et al. |
| 7,477,090 B2 | * | 1/2009 | Takahashi ..................... 327/512 |

(Continued)

FOREIGN PATENT DOCUMENTS

JP S5757642 U 4/1982

OTHER PUBLICATIONS

Poki Chen et. al.,"A Time-To-Digital-Converter-Based CMOS Smart Temperature Sensor", IEEE Journal of Solid-State Circuits, vol. 40, No. 8, pp. 1642-1648 (Aug. 2005).

(Continued)

*Primary Examiner* — William Hernandez
(74) *Attorney, Agent, or Firm* — Kenyon S. Jenckes

(57) ABSTRACT

Temperature-independent delay elements and oscillators are disclosed. In one design, an apparatus includes at least one delay element, a bias circuit, and a current source. The delay element(s) receive a charging current from the current source and provide a delay that is dependent on the charging current. Each delay element may be a current-starved delay element. The delay element(s) may be coupled in series to implement a delay line or in a loop to implement an oscillator. The bias circuit controls generation of the charging current based on a function of at least one parameter (e.g., a switching threshold voltage) of the at least one delay element in order to reduce variations in delay with temperature. The current source provides the charging current for the delay element(s) and is controlled by the bias circuit.

16 Claims, 10 Drawing Sheets

(56) References Cited

U.S. PATENT DOCUMENTS

| | | | |
|---|---|---|---|
| 7,498,859 B2* | 3/2009 | Kim | 327/262 |
| 7,557,631 B2* | 7/2009 | Sinha et al. | 327/261 |
| 7,973,612 B2 | 7/2011 | Raghunathan et al. | |
| 8,004,337 B2* | 8/2011 | Brannen | 327/264 |
| 8,264,260 B2* | 9/2012 | Ko et al. | 327/158 |
| 8,384,462 B2* | 2/2013 | Takatori | 327/262 |
| 8,390,352 B2* | 3/2013 | Seefeldt et al. | 327/161 |
| 8,390,355 B2* | 3/2013 | Quan et al. | 327/261 |
| 2007/0008022 A1* | 1/2007 | Kuramori | 327/261 |
| 2008/0284530 A1 | 11/2008 | Pellerano et al. | |
| 2009/0167446 A1 | 7/2009 | Higashi | |
| 2010/0007397 A1* | 1/2010 | Zhang et al. | 327/262 |
| 2011/0221409 A1* | 9/2011 | Nakamura et al. | 323/272 |

OTHER PUBLICATIONS

International Search Report and Written Opinion—PCT/US2013/046617, International Search Authority—European Patent Office, Dec. 2, 2013.

Partial International Search Report—PCT/US2013/046617—ISA/EPO—Sep. 26, 2013.

* cited by examiner

TEMPERATURE-INDEPENDENT OSCILLATORS AND DELAY ELEMENTS

BACKGROUND

I. Field

The present invention relates generally to circuits, and more specifically to delay elements and oscillators.

II. Background

A delay element is a circuit that can delay an input signal by a particular amount and provide an output signal that is a delayed version of the input signal. A delay element may be used for various purposes such as a delay line, an oscillator, etc. For example, a number of delay elements may be coupled in a loop to form a ring oscillator. The frequency of oscillation may be dependent on the number of delay elements coupled in the loop and the amount of delay provided by each delay element.

A delay element may be implemented with one or more transistors and one or more capacitors. A delay may be obtained by charging and discharging the capacitor(s) via the transistor(s), which may be controlled by an input signal. Circuit components (e.g., transistors) within the delay element may have characteristics that change with temperature. As a result, the amount of delay provided by the delay element may be dependent on temperature. Temperature-dependent delay may be undesirable. For example, the delay element may be used in an oscillator, and the frequency of oscillation may vary with temperature due to changes in the amount of delay provided by the delay element. It may be desirable for the delay element to provide a delay that varies as little as possible with temperature.

SUMMARY

Temperature-independent delay elements and oscillators are disclosed herein. A temperature-independent delay element can provide a delay that may vary by a small amount with temperature, e.g., as compared to a delay element that is not compensated for temperature. A temperature-independent oscillator can provide an oscillator signal having a frequency that may vary by a small amount with temperature, e.g., as compared to an oscillator that is not compensated for temperature.

In an exemplary design, an apparatus may include at least one delay element, a bias circuit, and a current source. The at least one delay element may receive a charging current from the current source and may provide a delay that is dependent on the charging current. Each delay element may comprise a current-starved delay element that can provide a delay that is dependent on the charging current. The at least one delay element may be coupled in series to implement a delay line or in a loop to implement an oscillator. The bias circuit may control the generation of the charging current based on a function of at least one parameter (e.g., a switching threshold voltage) of the at least one delay element in order to reduce variations in the delay of the at least one delay element with temperature. The current source may provide the charging current for the at least one delay element and may be controlled by the bias circuit.

Various aspects and features of the disclosure are described in further detail below.

DETAILED DESCRIPTION

The detailed description set forth below is intended as a description of exemplary designs of the present disclosure and is not intended to represent the only designs in which the present disclosure can be practiced. The term "exemplary" is used herein to mean "serving as an example, instance, or illustration." Any design described herein as "exemplary" is not necessarily to be construed as preferred or advantageous over other designs. The detailed description includes specific details for the purpose of providing a thorough understanding of the exemplary designs of the present disclosure. It will be apparent to those skilled in the art that the exemplary designs described herein may be practiced without these specific details. In some instances, well-known structures and devices are shown in block diagram form in order to avoid obscuring the novelty of the exemplary designs presented herein.

Temperature-independent delay elements and oscillators are disclosed herein and may be used for various purposes. Some exemplary circuits employing temperature-independent delay elements and temperature-independent oscillators are described below.

Figure 1:
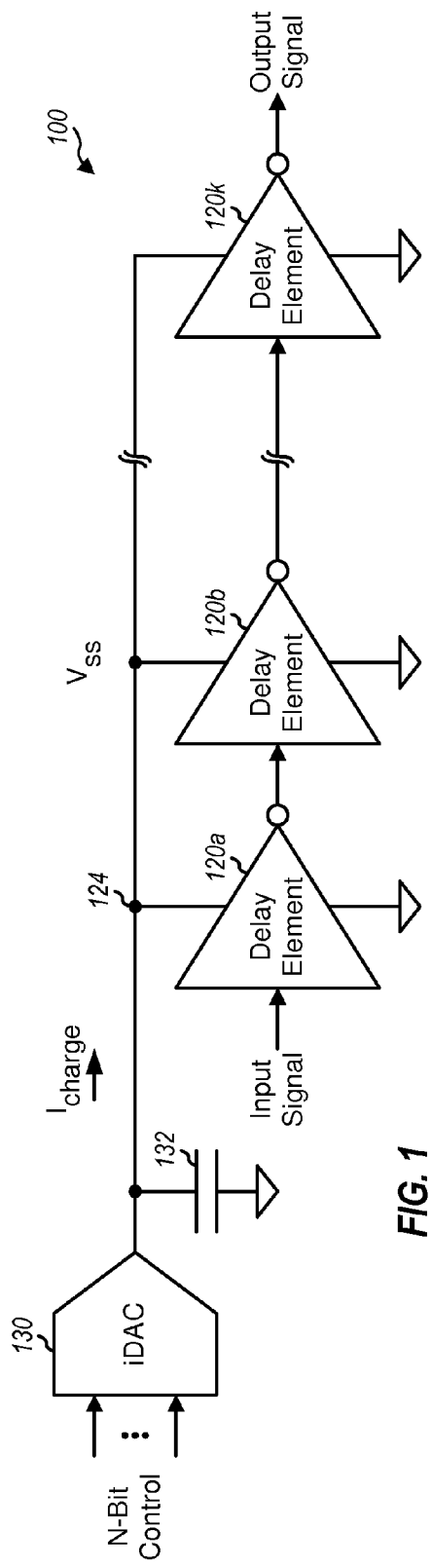
FIG. 1 shows a schematic diagram of a delay line.

FIG. 1 shows a schematic diagram of an exemplary design of a temperature-independent delay line 100. Delay line 100 includes multiple (K) temperature-independent delay elements 120a to 120k coupled in series. An input signal is provided to the input of the first delay element 120a. An output signal is provided by the last delay element 120k.

Delay elements 120a to 120k are coupled between a common node 124 and circuit ground. Each delay element 120 operates between a supply voltage ($V_{ss}$) provided at node 124 and circuit ground. Delay elements 120a to 120k may provide the same amount of delay or different amounts of delay. Each delay element 120 may provide an amount of delay that may be dependent on a charging current ($I_{charge}$) provided via node 124 but may vary little over temperature.

A current digital-to-analog converter (iDAC) 130 may receive an N-bit digital control and may provide the charging current and the supply voltage at node 124 for delay elements 120, where N may be any integer value. A capacitor 132 may be coupled between node 124 and circuit ground and may provide filtering of the supply voltage.

Figure 2:
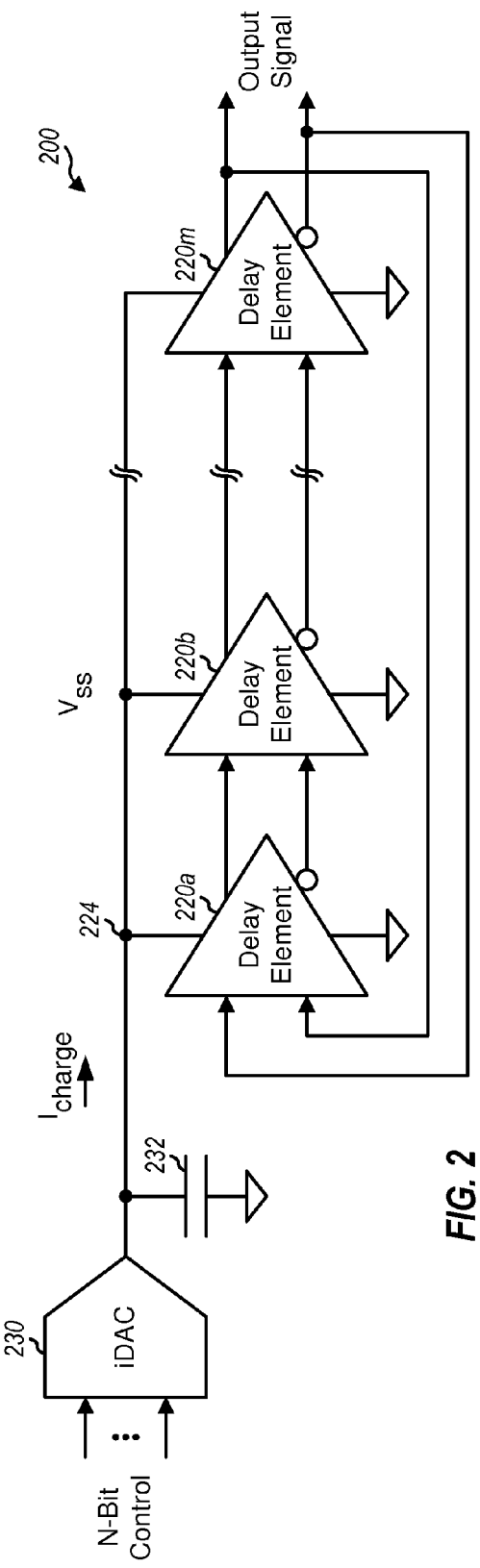
FIG. 2 shows a schematic diagram of an oscillator.

FIG. 2 shows a schematic diagram of an exemplary design of a temperature-independent oscillator 200. Oscillator 200 includes multiple (M) temperature-independent differential delay elements 220a to 220m coupled in a loop. Each delay element 220 provides a differential output signal to a subsequent delay element 220. If M is even, then the last delay element 220m may have its differential output signal swapped and provided to the input of the first delay element 220a, as shown in FIG. 2. If M is odd, then the differential output signal from the last delay element 220m may be provided directly to the input of the first delay element 220a (not shown in FIG. 2). An output signal is provided by the last delay element 220m.

Delay elements 220a to 220m are coupled between a common node 224 and circuit ground. Each delay element 220 operates between a supply voltage ($V_{ss}$) provided at node 224 and circuit ground. Delay elements 220a to 220m may provide the same amount of delay or different amounts of delay. Each delay element 220 may provide an amount of delay that may be dependent on a charging current ($I_{charge}$) provided via node 224 but may vary little over temperature.

An iDAC 230 may receive an N-bit digital control and may provide the charging current and the supply voltage at node 224 for oscillator 200. A capacitor 232 may be coupled between node 224 and circuit ground and may provide filtering of the supply voltage.

Delay elements 120 in FIG. 1 and delay elements 220 in FIG. 2 may be implemented in various manners. In an exemplary design, a delay element may be implemented with a current-starved delay element/cell.

Figures 3A, 3B:
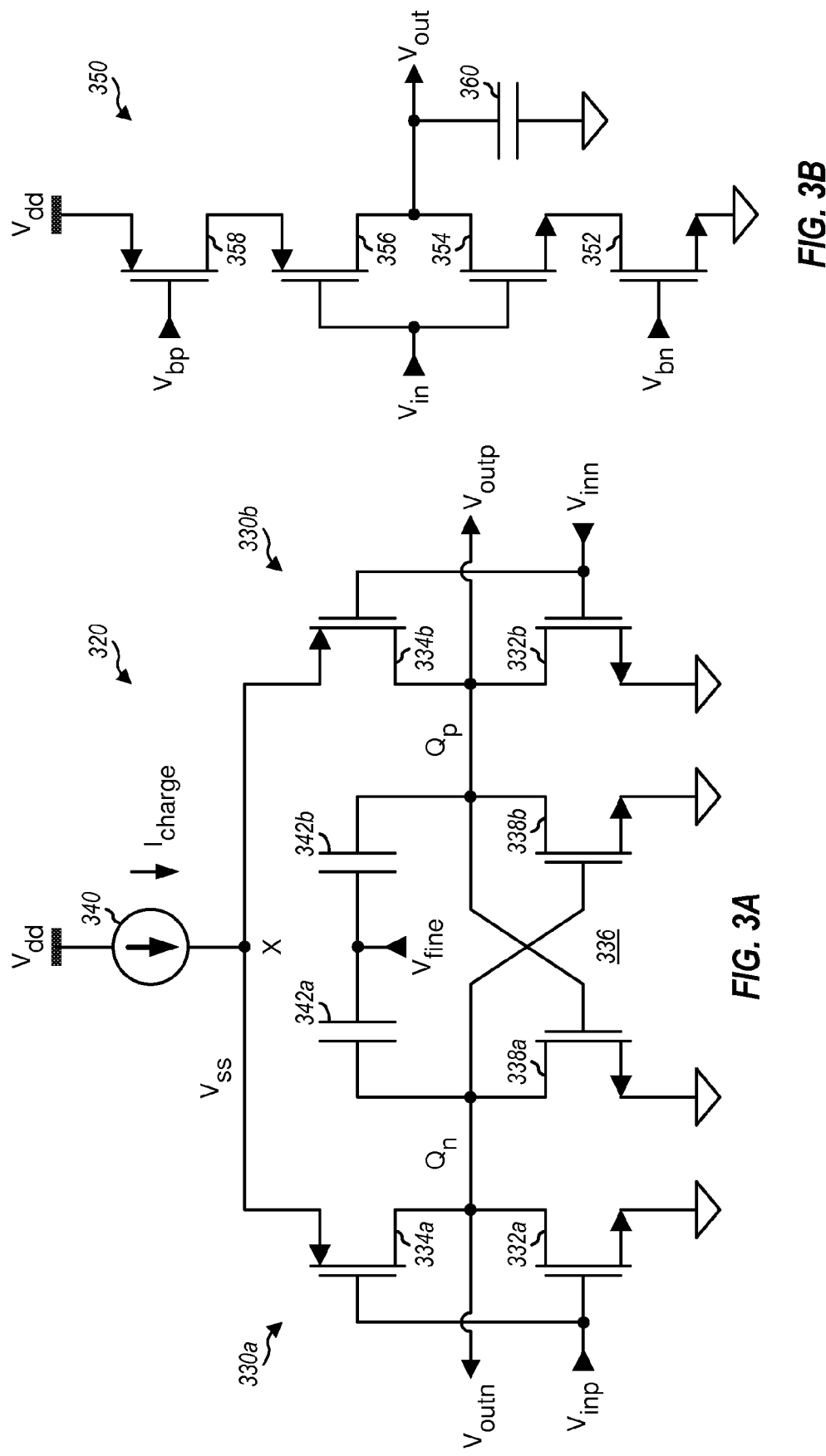
FIGS. 3A and 3B show schematic diagrams of two exemplary designs of a current-starved delay element.

FIG. 3A shows a schematic diagram of an exemplary design of a current-starved delay element 320, which may be used for each of delay elements 120a to 120k in FIG. 1 and for each of delay elements 220a to 220m in FIG. 2. Within delay element 320, an N-channel metal oxide semiconductor (NMOS) transistor 332a and a P-channel metal oxide semiconductor (PMOS) transistor 334a are coupled as an inverter 330a. The gates of MOS transistors 332a and 334a are coupled together and receive a non-inverting input signal ($V_{inp}$). The drains of MOS transistors 332a and 334a are coupled together at node $Q_n$ and provide an inverting output signal ($V_{outn}$). The source of NMOS transistor 332a is coupled to circuit ground, and the source of PMOS transistor 334a is coupled to node X. An NMOS transistor 338a has its source coupled to circuit ground, its drain coupled to node $Q_n$, and its gate coupled to node $Q_p$.

NMOS transistors 332b and 338b and PMOS transistor 334b are coupled in similar manner as NMOS transistors 332a and 338a and PMOS transistor 334a, respectively. MOS transistors 332a and 334a form a first inverter 330a, and MOS transistors 332b and 334b form a second inverter 330b. NMOS transistors 338a and 338b form a latch. The gates of MOS transistors 332b and 334b receive an inverting input signal ($V_{inn}$). The drains of MOS transistors 332b and 334b are coupled together at node $Q_p$ and provide a non-inverting output signal ($V_{outp}$).

Capacitors 342a and 342b are coupled in series and between node $Q_n$ and node $Q_p$. Capacitors 342a and 342b may each have a capacitance value of C, which may be a fixed value or a configurable value. A tuning voltage ($V_{fine}$) may be provided to the common node between capacitors 342a and 342b and may be used to adjust the capacitance of capacitors 342a and 342b for fine tuning of delay. A current source 340 is coupled between a power supply voltage ($V_{dd}$) and node X and provides a charging current of $I_{charge}$ and a supply voltage of $V_{ss}$ at node X. Current source 340 may be an iDAC or some other circuit and may generate the charging current based on an N-bit digital control (not shown in FIG. 3A).

Delay element 320 operates as follows. Capacitors 342a and 342b are charged by PMOS transistors 334a and 334b and discharged by NMOS transistors 332a and 332b. When the $V_{inp}$ signal is at logic high and the $V_{inn}$ signal is at logic low, MOS transistors 332a and 334b are turned On, and MOS transistors 332b and 334a are turned Off. Capacitor 342b is charged by the charging current from current source 340 via MOS transistor 334b, and capacitor 342a is discharged by MOS transistor 332a. Conversely, when the $V_{inp}$ signal is at logic low and the $V_{inn}$ signal is at logic high, MOS transistors 332b and 334a are turned On, and MOS transistors 332a and 334b are turned Off. Capacitors 342a is charged by the charging current from current source 340 via MOS transistors 334a, and capacitor 342b is discharged by MOS transistor 332b. NMOS transistors 338a and 338b function as a latch and ensure that a 180-degree phase relationship exists between node Qp and node Qn. This ensures an oscillator implemented with delay element 320 does not latch-up.

Delay element 320 may provide a delay of $T_{delay}$, which may be expressed as:

$$T_{delay} = \frac{C_{eff} \cdot V_{th}}{I_{charge}}, \quad \text{Eq (1)}$$

where $C_{eff}$ is the capacitance of delay element 320, e.g., $C_{eff}=C/2$, and $V_{th}$ is a switching threshold voltage of delay element 320.

The switching threshold voltage of delay element 320 may be dependent on a threshold voltage of MOS transistors used to implement delay element 320. The $V_{ss}$ supply voltage may be approximately equal to twice the switching threshold voltage of the delay element, or $V_{ss} \approx 2 \cdot V_{th}$.

FIG. 3B shows a schematic diagram of an exemplary design of a current-starved delay element 350, which may also be used for each of delay elements 120a to 120k in FIG. 1 and for each of delay elements 220a to 220m in FIG. 2. Within delay element 350, an NMOS transistor 354 and a PMOS transistor 356 are coupled as an inverter. The gates of MOS transistors 354 and 356 are coupled together and receive an input signal ($V_{in}$). The drains of MOS transistors 354 and 356 are coupled together and provide an output signal ($V_{out}$). An NMOS transistor 352 has its source coupled to circuit ground, its gate receiving a first bias voltage ($V_{bn}$), and its drain coupled to the source of NMOS transistor 354. A PMOS transistor 358 has its source coupled to a power supply voltage ($V_{dd}$), its gate receiving a second bias voltage ($V_{bp}$), and its drain coupled to the source of PMOS transistor 356.

A capacitor 360 has one end coupled to the drains of MOS transistors 354 and 356 and its other end coupled to circuit ground. Capacitor 360 may be charged via MOS transistors 356 and 358 when the input signal is at logic low and may be discharged via NMOS transistors 352 and 354 when the input signal is at logic high. The $V_{bn}$ and $V_{bp}$ bias voltages may be selected to provide the desired amount of charging and discharging current for capacitor 360. Delay element 350 may provide a delay of $T_{delay}$, which may be expressed in similar manner as equation (1).

As shown in equation (1), the delay of delay current-starved delay element 320 (and also the delay of current-starved delay element 350) may be linearly dependent on the capacitance and the switching threshold voltage of the delay element and may be inversely related to the charging current. The switching threshold voltage may have a large temperature coefficient and may change by a large amount with temperature. Consequently, the delay of delay element 320 (and also the delay of delay element 350) may change by a large amount with temperature.

In an aspect of the present disclose, a charging current ($I_{charge}$) of a delay element may be designed to be proportional to a switching threshold voltage ($V_{th}$) and possibly a capacitance ($C_{eff}$) of the delay element. This may result in the temperature dependence of the delay being substantially reduced and hence a smaller change in the delay of the delay element with temperature.

Figure 4A:
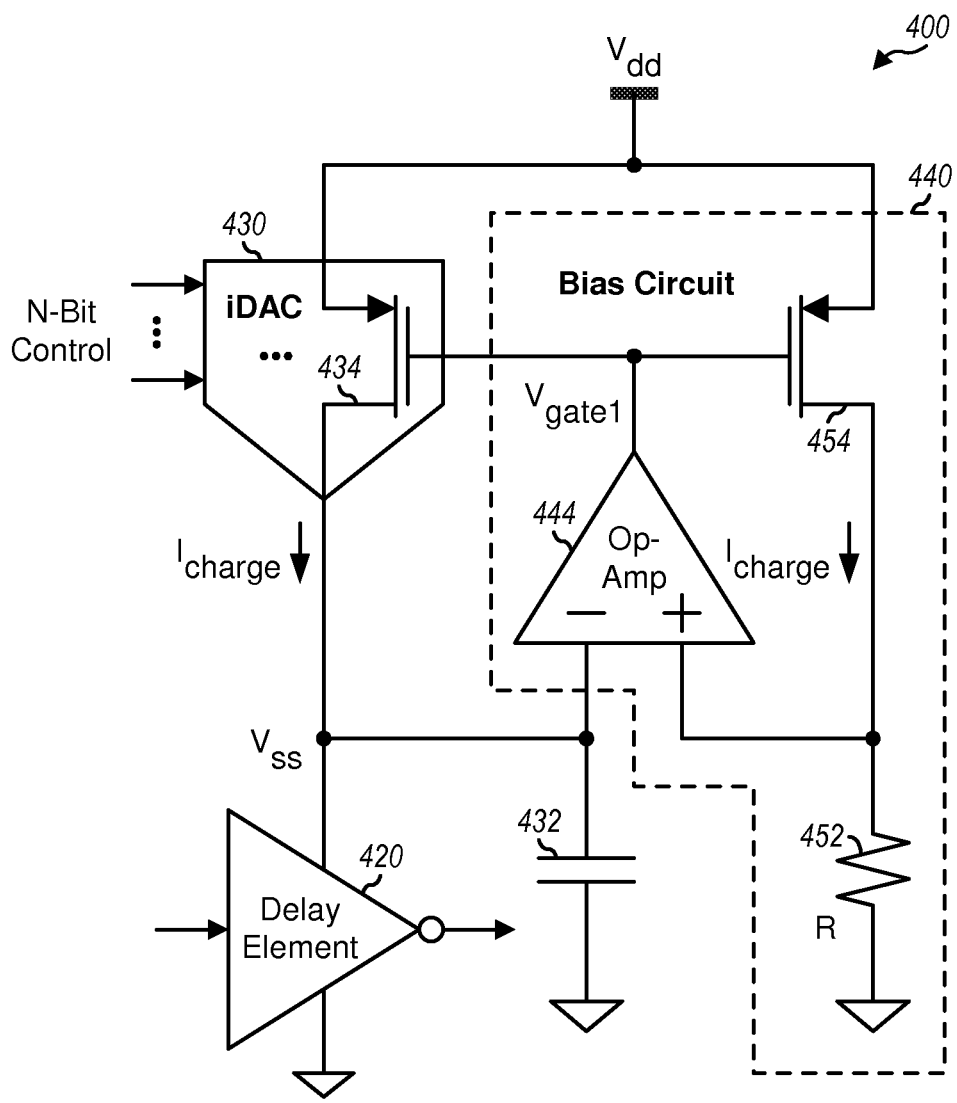
FIGS. 4A and 4B show schematic diagrams of two exemplary designs of a bias circuit for a temperature-independent delay circuit.

FIG. 4A shows a schematic diagram of an exemplary design of a temperature-independent delay circuit 400. Delay circuit 400 includes a current-starved delay element 420, an iDAC 430, and a bypass capacitor 432, which are coupled in similar manner as delay elements 120, iDAC 130, and capacitor 132 in FIG. 1. Delay circuit 400 further includes a bias circuit 440 comprising an operational amplifier (op-amp) 444, a resistor 452, and a PMOS transistor 454.

iDAC 430 may include an array of current sources comprising PMOS transistors. For clarity, only one PMOS transistor 434 for one current source is shown in FIG. 4A. PMOS transistor 434 has its source coupled to a power supply voltage ($V_{dd}$), its gate coupled to an output of op-amp 444, and its drain coupled to the output of iDAC 430 and also to an inverting input of op-amp 444. One or more MOS transistors may also be coupled in series with PMOS transistor 434. One or more additional PMOS transistors within iDAC 430 may also be coupled in parallel with PMOS transistor 434. PMOS transistor 454 has its source coupled to the $V_{dd}$ power supply voltage, its gate coupled to the output of op-amp 444, and its drain coupled to a non-inverting input of op-amp 444. Resistor 452 has one end coupled to the drain of PMOS transistor 454 and the other end coupled to circuit ground. Resistor 452 has a resistance of R, which may be a fixed value or a configurable value.

PMOS transistors 434 and 454 are coupled as a current mirror, with the amount of current flowing through PMOS transistor 434 being equal to the amount of current flowing through PMOS transistor 454 if PMOS transistors 434 and 454 have the same transistor size. Op-amp 444 provides a gate voltage ($V_{gate1}$) to the gates of PMOS transistors 434 and 454 such that the supply voltage ($V_{ss}$) at the output of iDAC 430 is approximately equal to twice the switching threshold voltage ($V_{th}$) of delay element 420. The charging current provided by iDAC 430 (and also the current provided by PMOS transistor 454) may then be given as:

$$I_{charge} = \frac{2 \cdot V_{th} \cdot Dcode}{R}, \quad \text{Eq (2)}$$

where Dcode is a digital value (in decimal) provided to iDAC 430.

Combining equations (1) and (2), the delay provided by delay element 420 in FIG. 4A may be expressed as:

$$T_{delay} = M \cdot C_{eff} \cdot V_{th} \cdot \frac{R}{2 \cdot V_{th} \cdot Dcode} = \frac{M \cdot C_{eff} \cdot R}{2 \cdot Dcode}. \quad \text{Eq (3)}$$

As shown in equation (3), the delay of delay element 420 in FIG. 4A may be dependent on only the capacitance ($C_{eff}$) of delay element 420 and the resistance (R) of resistor 452 in bias circuit 440, since M and Dcode may be fixed values. The capacitance of delay element 420 may have a small temperature coefficient and may vary by a small amount with temperature. The resistance of resistor 452 may also have a small temperature coefficient and may vary by a small amount with temperature, e.g., by approximately 5% over −40° C. to +125° C. The delay of delay element 420 in FIG. 4A may be independent of the switching threshold voltage ($V_{th}$), which may have a large temperature coefficient and may vary by a large amount with temperature. By making the delay of delay element 420 be independent of the switching threshold voltage, large variations in the delay of delay element 420 over temperature may be mitigated or avoided.

Figure 4B:
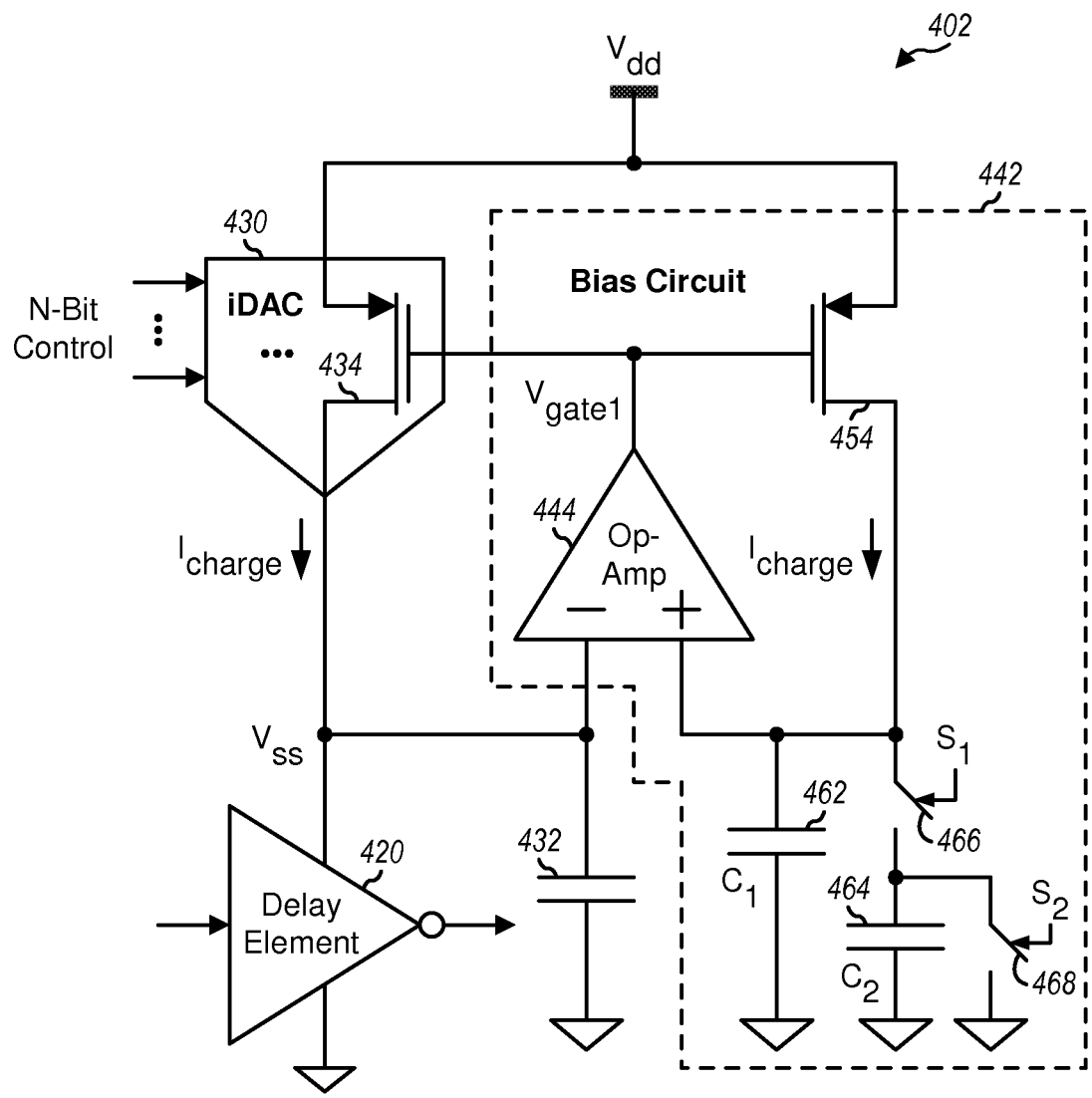

FIG. 4B shows a schematic diagram of an exemplary design of a temperature-independent delay circuit 402. Delay circuit 402 includes current-starved delay element 420, iDAC 430, and bypass capacitor 432, which are coupled in similar manner as delay elements 120, iDAC 130, and capacitor 132 in FIG. 1. Delay circuit 402 further includes a bias circuit 442.

iDAC 430 may include a number of PMOS transistors for an array of current sources. For clarity, only one PMOS transistor 434 is shown in FIG. 4B and is coupled as described above for FIG. 4A. Bias circuit 442 includes op-amp 444 and PMOS transistor 454, which are coupled as described above for FIG. 4A. Bias circuit 442 further includes capacitors 462 and 464 and switches 466 and 468, which are coupled as a switch-capacitor resistor. Capacitor 462 is coupled between the drain of PMOS transistor 454 and circuit ground. Capacitor 464 is coupled in series with switch 466, and the series combination is coupled between the drain of PMOS transistor 454 and circuit ground. Switch 468 is coupled in parallel with capacitor 464. Capacitor 462 has a capacitance of $C_1$, which may be a fixed value or a configurable value. Capacitor 464 has a capacitance of $C_2$, which may also be a fixed value or a configurable value.

Switch 466 receives a first control signal ($S_1$), and switch 468 receives a second control signal ($S_2$). The $S_1$ and $S_2$ signals may be generated based on different phases of a clock signal. For example, the $S_1$ signal may close switch 466 during logic high on the clock signal, and the $S_2$ signal may close switch 468 during logic low on the clock signal. Capacitor 466 may be (i) charged by the charging current from PMOS transistor 454 via switch 466 during logic high of the clock signal and (ii) discharged via switch 468 during logic low of the clock signal. The resistance synthesized by the switch-capacitor circuit may be given as:

$$R = \frac{1}{C_2 \cdot f_{ref}}, \quad \text{Eq (4)}$$

where $f_{ref}$ is the switching rate of the $S_1$ and $S_2$ signals. The switching rate may be 10 MHz or some other rate.

The charging current provided by iDAC 430 with bias circuit 442 may be expressed as:

$$I_{charge} = \frac{2 \cdot V_{th} \cdot Dcode}{R} = 2 \cdot V_{th} \cdot C_2 \cdot f_{ref} \cdot Dcode. \quad \text{Eq (5)}$$

Combining equations (1) and (5), the delay provided by delay element 420 in FIG. 4B may be expressed as:

$$T_{delay} = C_{eff} \cdot V_{th} \cdot \frac{1}{2 \cdot V_{th} \cdot C_2 \cdot f_{ref} \cdot Dcode} = \frac{C_{eff}}{2 \cdot C_2 \cdot f_{ref} \cdot Dcode}. \quad \text{Eq (6)}$$

As shown in equation (6), the delay of delay element 420 in FIG. 4B may be dependent on only the capacitance ($C_{eff}$) of delay element 420, the capacitance ($C_2$) of capacitor 464 in bias circuit 442, and the switching reference frequency ($f_{ref}$) of the $S_1$ and $S_2$ signals. The ratio of $C_{eff}$ to $C_2$ may have a small temperature coefficient and may vary by a small amount with temperature if the capacitors are realized using the same physical capacitor types. The switching reference frequency may be generated to have a small temperature coefficient and may vary by a small amount with temperature. The delay of delay element 420 in FIG. 4B may be independent of the switching threshold voltage ($V_{th}$), and large variations in the delay of delay element 420 over temperature may be mitigated or avoided.

FIGS. 4A and 4B show two exemplary designs of a bias circuit that can generate a charging current for a delay element such that its delay has a small temperature coefficient. This may be achieved by generating the charging current to be proportional to the switching threshold voltage of the delay element, e.g., as shown in equation (2) or (5). The charging current may then compensate for changes in the delay of the delay element versus the switching threshold voltage, e.g., as shown in equation (1). The charging current may also be generated to be proportional to the switching threshold voltage in other manners. For example, resistor 452 in FIG. 4A may be replaced with an NMOS transistor that is biased in a linear region.

For simplicity, FIGS. 4A and 4B show iDAC 430 including a single pass PMOS transistor 434. In general, an iDAC may include any number of pass transistors coupled in series and any number of pass transistors coupled in parallel. The number of pass transistors to couple in series or in parallel may be dependent on various factors such as the number of bits of resolution of the iDAC, the power supply voltage, etc.

Figure 5:
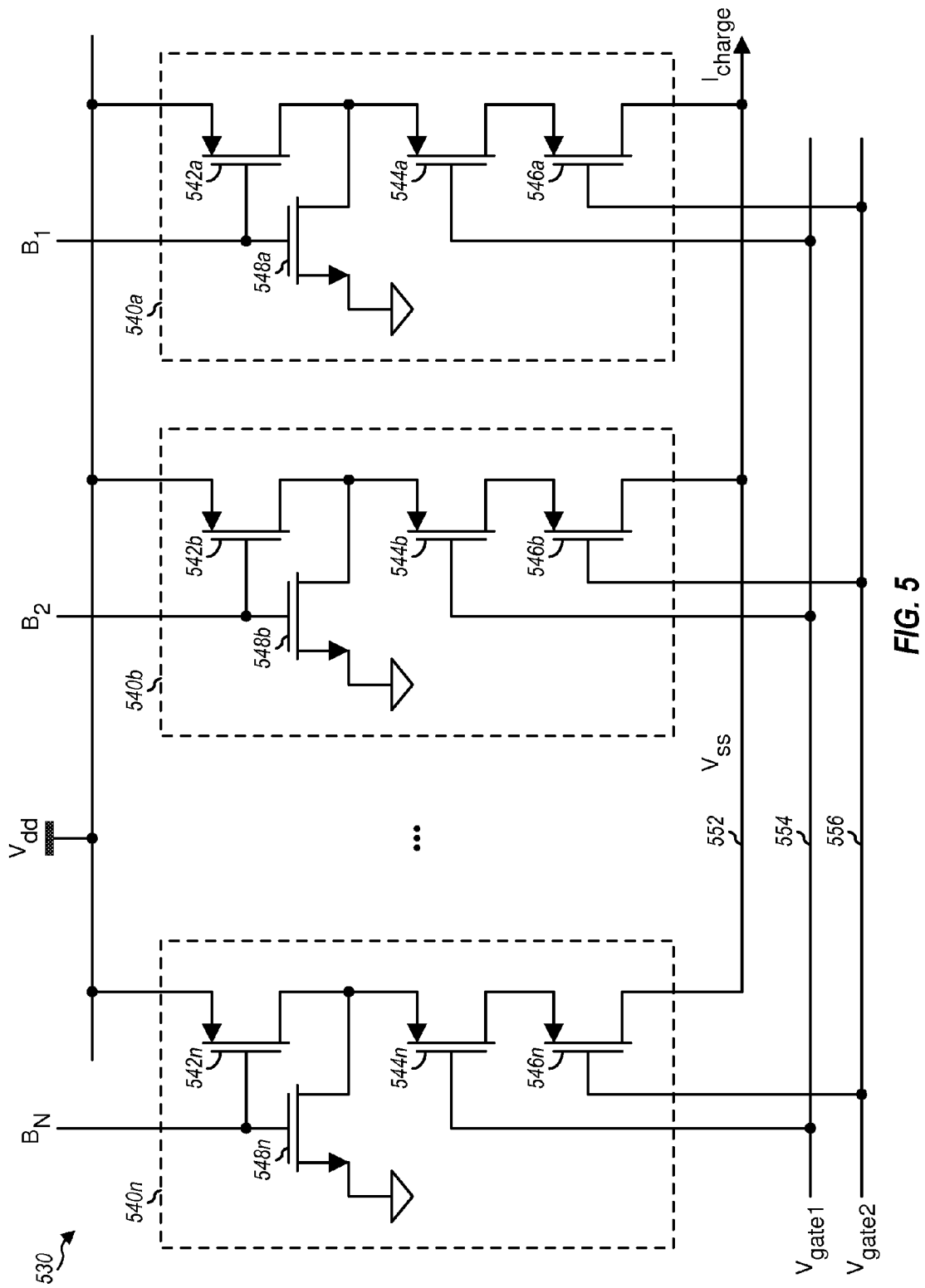
FIG. 5 shows a schematic diagram of a current digital-to-analog converter.

FIG. 5 shows a schematic diagram of an exemplary design of an iDAC 530, which may be used for iDAC 130 in FIG. 1, iDAC 230 in FIG. 2, or iDAC 430 in FIGS. 4A and 4B. iDAC 530 includes N current sources 540a to 540n for N stages of the iDAC, where N may be any integer value greater than one. Each current source 540 includes three series-coupled PMOS transistors 542, 544 and 546 and a shunt-coupled NMOS transistor 548. Within current source 540a, PMOS transistor 542a has its source coupled to the Vdd power supply voltage, its gate receiving a $B_1$ control signal, and its drain coupled to the source of PMOS transistor 544a. PMOS transistor 544a has its gate receiving a first gate voltage ($V_{gate1}$) on line 554 and its drain coupled to the source of PMOS transistor 546a. PMOS transistor 546a has its gate receiving a second gate voltage ($V_{gate2}$) on line 556 and its drain providing the $V_{ss}$ voltage on line 552. MOS transistors 542 to 548 in each remaining current source 540 are coupled in similar manners as MOS transistors 542a to 548a in current source 540a.

The $B_1$ to $B_N$ signals may individually enable or disable the N current sources 540a to 540n, respectively. Each current source 540 may provide its current (i) via PMOS transistors 542 to 546 to line 552 when the current source is selected or (ii) via MOS transistors 542 and 548 to circuit ground when the current source is not selected. Within each current source 540, PMOS transistors 542 and NMOS transistor 548 operate as a switch that can steer current to line 552 or circuit ground. PMOS transistor 544 is a current-source transistor that corresponds to PMOS transistor 434 within iDAC 430 in FIGS. 4A and 4B. PMOS transistor 546 is a cascode transistor that can provide a higher output impedance for current source 540. The $V_{gate1}$ voltage provides the proper gate voltage to bias PMOS transistors 544a to 544n and may be provided by op-amp 444 in FIGS. 4A and 4B. The $V_{gate2}$ voltage provides the proper gate voltage to bias PMOS transistors 546a to 546n and may be any suitable voltage.

In one design, iDAC 530 may be implemented with binary weighting. In this design, current source 540a may be associated with a least significant bit (LSB) and may provide a current of $I_{unit}$ when enabled, current source 540b may be associated with the next LSB and may provide a current of $2I_{unit}$ when enabled, and so on, and current source 540n may be associated with a most significant bit (MSB) and may provide a current of $I_{unit}2^{N-1}$ when enabled. For example, $I_{unit}$ may be equal to four microamperes (μA), current source 540a may provide 4 μA when enabled, current source 540b may provide 8 μA when enabled, and so on. In another design, iDAC 530 may be implemented with thermometer weighting. In this design, each current source 540 may provide the same amount of current of $I_{unit}$ when enabled. For both designs, the N control signals $B_1$ to $B_N$ may be representative of a multi-bit DAC value of a desired oscillation frequency of an oscillator or a desired delay of a delay line.

Temperature-independent delay elements may be obtained as shown in FIGS. 4A and 4B. Temperature-independent delay elements may be used to implement various temperature-independent circuits such as delay lines, oscillators, frequency locked loops (FLLs), phase-locked loops (PLLs), etc.

Figure 6:
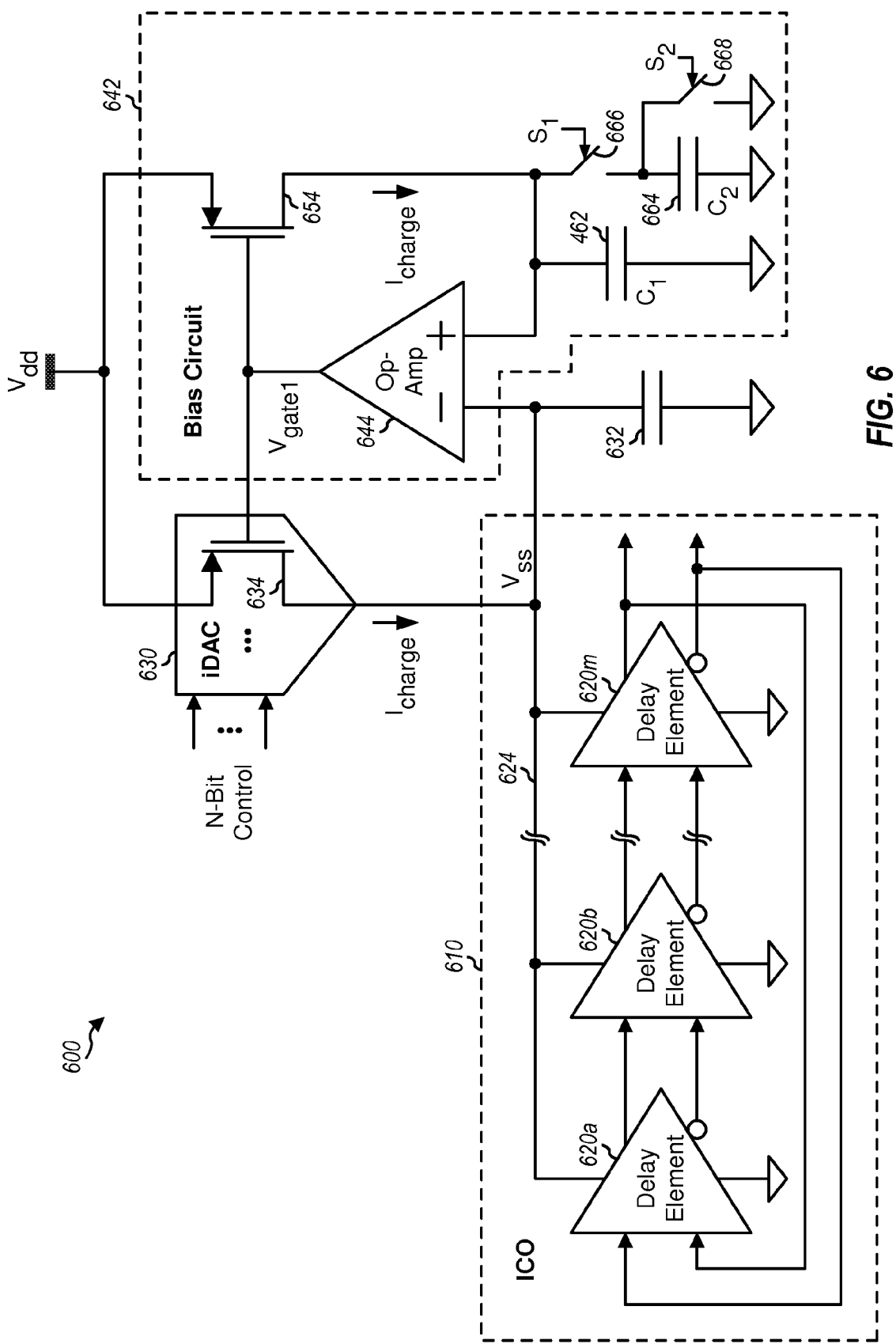
FIG. 6 shows a schematic diagram of a temperature-independent digitally controlled oscillator.

FIG. 6 shows a schematic diagram of an exemplary design of a temperature-independent digitally controlled oscillator (DCO) 600. DCO 610 includes a current-controlled oscillator (ICO) 610, an iDAC 630, a bypass capacitor 632, and a bias circuit 640. ICO 610 includes multiple (M) temperature-independent differential delay elements 620a to 620m coupled in a loop and implementing a ring oscillator. Delay elements 620a to 620m are coupled between a common node 624 and circuit ground. Each delay element 620 operates between a supply voltage ($V_{ss}$) provided at node 624 and circuit ground. Each delay element 620 provides an amount of delay that is dependent on a charging current ($I_{charge}$) from iDAC 630 but may vary little with temperature.

iDAC 630 may receive an N-bit digital control and may provide the charging current and the supply voltage at node 624 for DCO 600, where N may be any integer value. Bypass capacitor 632 may be coupled between node 624 and circuit ground and may provide filtering of the supply voltage. iDAC 630 includes PMOS transistor 634, which is coupled as described above for FIG. 4A. Bias circuit 642 includes an op-amp 644, a PMOS transistor 654, capacitors 662 and 664, and switches 666 and 668, which are coupled as described above for FIG. 4B.

Op-amp 644 can set the voltage at the gates of PMOS transistors 634 and 654 such that the supply voltage ($V_{ss}$) at the output of iDAC 630 is approximately equal to twice the switching threshold voltage ($V_{th}$) of delay elements 620. The charging current provided by iDAC 630 (and also the current provided by PMOS transistor 654) may be given as shown in equation (5) and may be proportional to the switching threshold voltage of delay elements 620 within ICO 610.

The frequency of oscillation of ICO 610 may be given as follows:

$$f_{osc} = \frac{1}{2 \cdot M \cdot T_{delay}} = \frac{I_{charge}}{2 \cdot M \cdot C_{eff} \cdot V_{th}} = \frac{C_2 \cdot f_{ref} \cdot Dcode}{M \cdot C_{eff}}, \quad \text{Eq (7)}$$

where $f_{osc}$ is the frequency of oscillator of ICO 610.

As shown in equation (7), for the design shown in FIG. 6, the oscillation frequency is (i) proportional to a ratio of capacitors ($C_2/C_{eff}$) and the switching reference frequency of the switch-capacitor resistor ($f_{ref}$) and (ii) inversely proportional to the number of delay elements (M) used for ICO 610. The number of delay elements (M) is not dependent on temperature. The capacitor ratio ($C_2/C_{eff}$) and the switching reference frequency ($f_{ref}$) may have small temperature coefficients and may vary by small amounts with temperature. The oscillation frequency is not dependent on the switching threshold voltage of delay elements 620.

Bias circuit 642 in FIG. 6 may be replaced with bias circuit 440 in FIG. 4A. In this case, the charging current from iDAC 630 may be given as shown in equation (2), and the frequency of oscillation of ICO 610 may be given as follows:

$$f_{osc} = \frac{1}{2 \cdot M \cdot T_{delay}} = \frac{I_{charge}}{2 \cdot M \cdot C_{eff} \cdot V_{th}} = \frac{Dcode}{M \cdot C_{eff} \cdot R}. \quad \text{Eq (8)}$$

As shown in equation (8), using bias circuit 440 in FIG. 4A instead of bias circuit 642 in FIG. 6, the oscillation frequency is inversely proportional to the number of delay elements (M) used for ICO 610, the capacitance ($C_{eff}$) of each delay element 620, and the resistance (R) of resistor 452 in bias circuit 440. The capacitance $C_{eff}$ and the resistance R may have small temperature coefficients and may vary by small amounts with temperature. The oscillation frequency is not dependent on the switching threshold voltage of delay elements 620.

Figure 7:
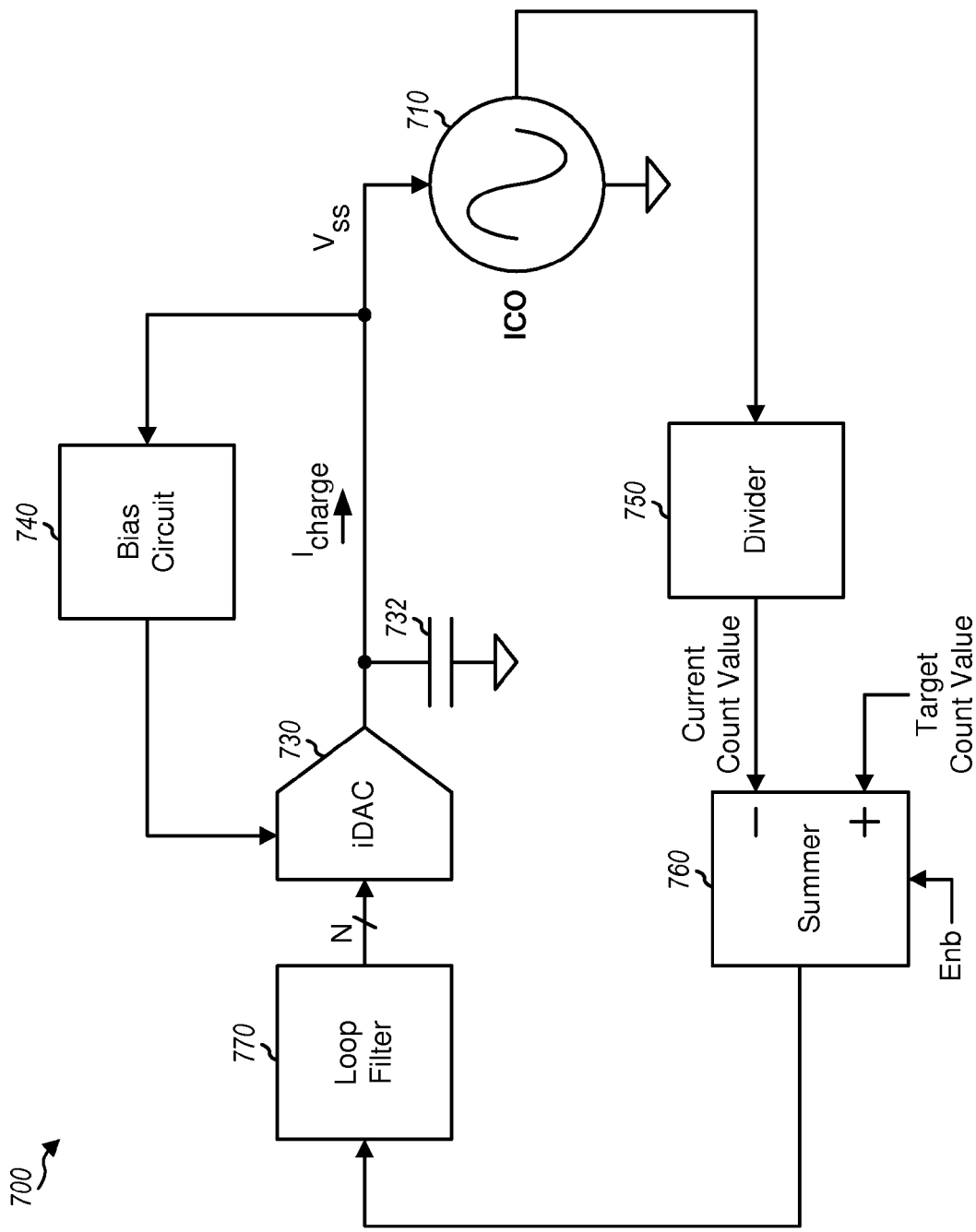
FIG. 7 shows a block diagram of a digital frequency locked loop.

FIG. 7 shows a block diagram of an exemplary design of a digital frequency locked loop (DFLL) 700 that incorporates a temperature-independent ICO. Within DFLL 700, an ICO 710 receives a charging current from an iDAC 730 and provides an oscillator signal having a frequency determined by the charging current. ICO 710 may be implemented with ICO 610 in FIG. 6 or some other ICO. iDAC 730 may be implemented with iDAC 530 in FIG. 5 or some other iDAC. A bypass capacitor 732 is coupled between the output of iDAC 730 and circuit ground and provides filtering of the supply voltage at the output of iDAC 730. A bias circuit 740 has an input coupled to the output of iDAC 730 and an output coupled to a control input of iDAC 730. Bias circuit 740 senses the supply voltage ($V_{ss}$) at the output of iDAC 730 and generates a control voltage for the pass transistors within iDAC 730 such that the charging current from iDAC 730 is proportional to the switching threshold voltage of the delay elements within ICO 710, e.g., as shown in equation (2) or (5). Bias circuit 740 may be implemented with bias circuit 440 in FIG. 4A, bias circuit 442 in FIG. 4B, or some other bias circuit.

A divider 750 receives the oscillator signal from ICO 710 and divides the oscillator signal in frequency by a factor L, where L may be any integer value. Divider 750 provides a count output that is incremented for each cycle of the oscillator signal. When enabled by an enable signal (Enb), a summer 760 receives the current count value from divider 750, subtracts the current count value from a target count value, and provides a count difference, which may be expressed as:

$$\text{Count\_Difference} = \left\lfloor L - \frac{f_{osc}}{f_{ref}} \right\rfloor, \quad \text{Eq (9)}$$

where
$f_{osc}$ is an oscillation frequency of ICO 710,
$f_{ref}$ is a frequency of the enable signal, and
"$\lfloor \ \rfloor$" denotes a floor operation.

As shown in equation (9), the count difference is dependent on the oscillation frequency and may be used to adjust ICO 710 to obtain the desired oscillation frequency, which may be given in terms of $f_{ref}$ and L. A loop filter 770 receives the count difference from summer 760, filters the count difference, and provides an N-bit digital control for iDAC 730. The digital control causes iDAC 730 to generate the proper charging current for ICO 710 to obtain the desired oscillation frequency.

Figure 8:
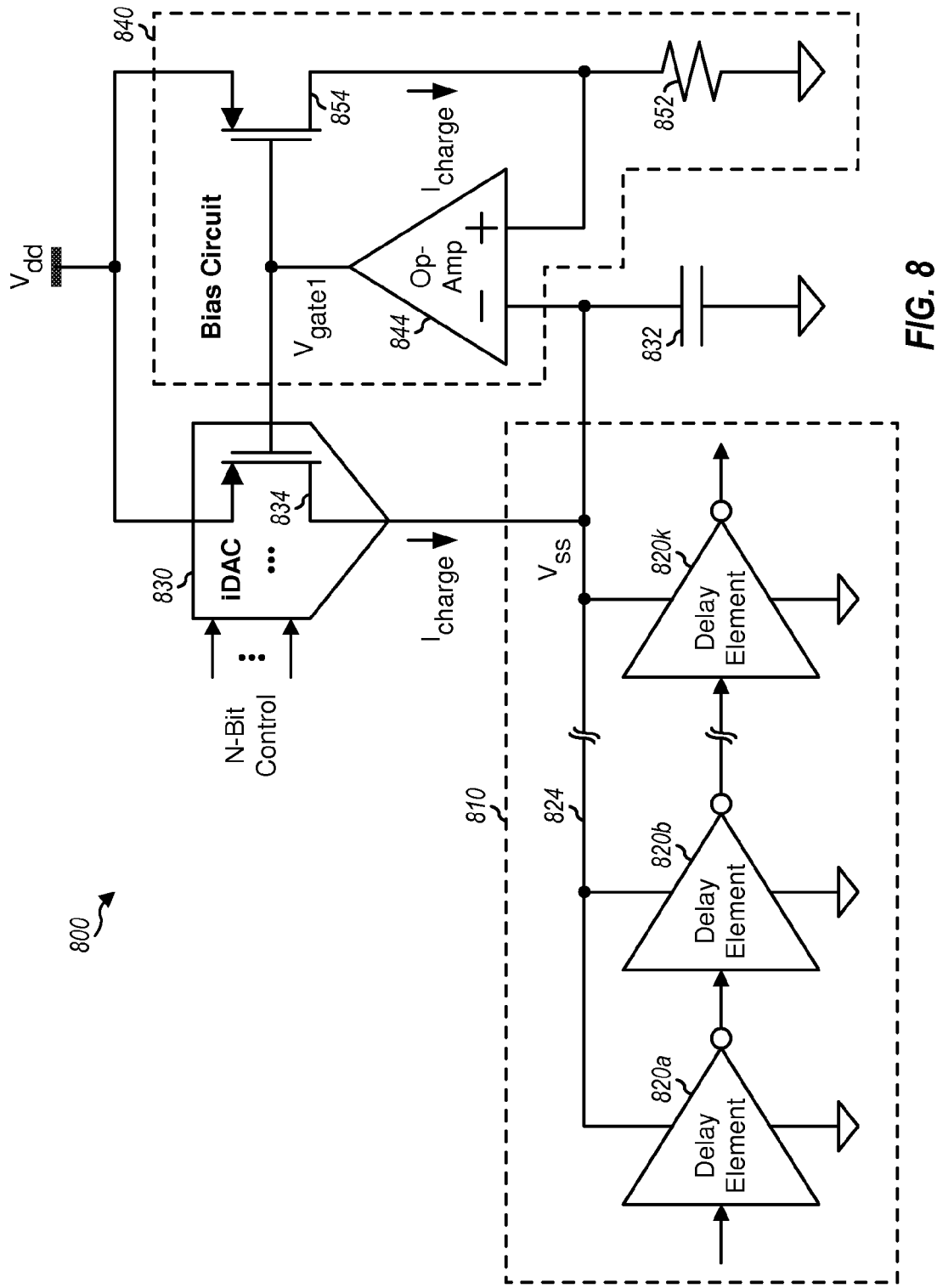
FIG. 8 shows a block diagram of a temperature-independent delay circuit.

FIG. 8 shows a block diagram of an exemplary design of a temperature-independent delay circuit 800, which may be used in a delay locked loop (DLL) or some other circuit. Delay circuit 800 includes a delay line 810, an iDAC 830, a bypass capacitor 832, and a bias circuit 840. Delay line 810 includes multiple (K) temperature-independent delay elements 820a to 820k coupled in a series. An input signal is provided to the input of the first delay element 820a, and an output signal is provided by the last delay element 820k. Delay elements 820a to 820k are coupled between a common node 824 and circuit ground. Each delay element 820 operates between a supply voltage ($V_{ss}$) provided at node 824 and circuit ground. Each delay element 820 provides an amount of delay that is dependent on a charging current ($I_{charge}$) from iDAC 830 but may vary little with temperature.

iDAC 830 receives an N-bit digital control and provides the charging current and the supply voltage at node 824 for delay line 810, where N may be any integer value. Bypass capacitor 832 is coupled between node 824 and circuit ground and provides filtering of the supply voltage. iDAC 830 includes a PMOS transistor 834, which is coupled as described above for FIG. 4A. Bias circuit 840 includes an op-amp 844, a resistor 852, and a PMOS transistor 854, which are coupled as described above for FIG. 4A. Bias circuit 840 may be replaced with bias circuit 442 in FIG. 4B or some other bias circuit.

Figure 9:
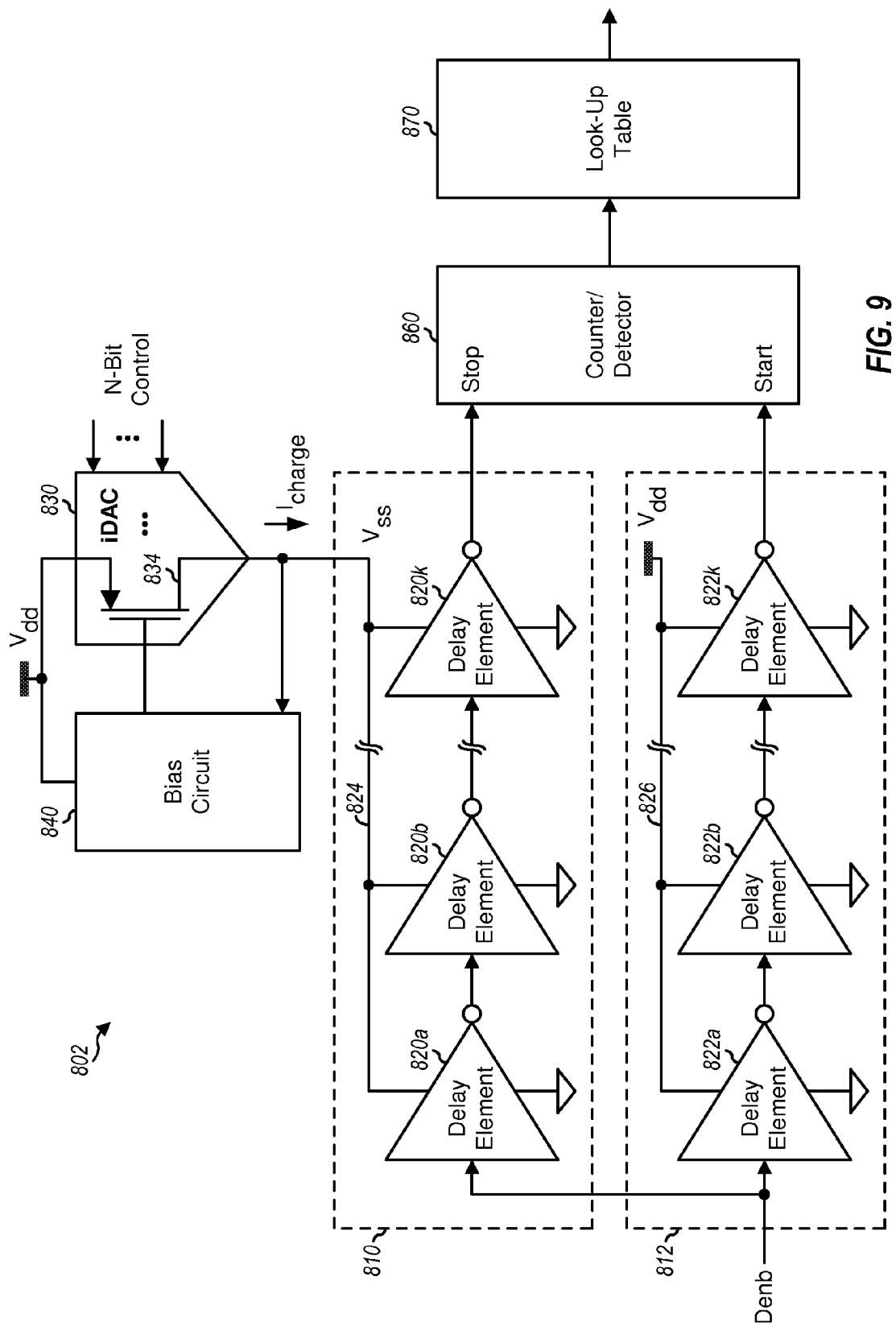
FIG. 9 shows a block diagram of a temperature sensor circuit.

FIG. 9 shows a block diagram of an exemplary design of a temperature sensor circuit 802. Temperature sensor circuit 802 includes all of the circuits in FIG. 8. Temperature sensor circuit 802 further includes a temperature-dependent delay line 812, a counter/detector 860, and a look-up table/conversion circuit 870. Delay line 812 includes multiple (K) delay elements 822a to 822k coupled in a series. Delay elements 822a to 822k are coupled between a common node 826 and circuit ground. A power supply voltage ($V_{dd}$) is provided to node 826. Each delay element 822 operates between the $V_{dd}$ power supply voltage at node 826 and circuit ground. Each delay element 822 provides an amount of delay that is dependent on temperature.

An enable signal (Denb) is provided to the first delay element 820a of delay line 810 as well as the first delay element 822a of delay line 812. The last delay element 820k of delay line 810 provides a first output signal to counter/detector 860. The last delay element 822k of delay line 812 provides a second output signal to counter/detector 860. The first output signal has a first delay that varies by a small amount over temperature due to bias circuit 840. The second output signal has a second delay that varies by a larger amount over temperature due to no compensation for changes in the switching threshold voltage with temperature for delay elements 822 within delay line 812. Counter/detector 860 determines the difference in delay between the first and second output signals and provides the delay difference. Counter/detector 860 may comprise a counter that starts counting on a rising edge of the second output signal from delay line 812 and stops counting on a rising edge of the first output signal. Look-up table 870 receives the delay difference and provides a sensed temperature corresponding to the detected delay difference.

In another exemplary design of a temperature sensor circuit, delay line 810 in FIG. 8 may be replaced with a first ICO operating between the $V_{ss}$ supply voltage and circuit ground (e.g., ICO 610 in FIG. 6), and delay line 812 may be replaced with a second ICO operating between the $V_{dd}$ power supply voltage and circuit ground. Counter/detector 860 may then count (i) the number of clock cycles of a first oscillator signal from the first ICO within a predetermined time period and (ii)

the number of clock cycles of a second oscillator signal from the second ICO within the predetermined time period. The difference between the first cycle count for the first ICO and the second cycle count for the second ICO may be provided to look-up table 870, which may provide the sensed temperature.

The temperature-independent delay elements and oscillators described herein may provide various advantages. The temperature-independent delay elements and oscillators may improve performance and reduce variations in delay or oscillation frequency over temperature, which may be desirable. The temperature-independent delay elements and oscillators may also reduce circuit area and provide other advantages. For example, a DCO may comprise an ICO and a segmented DAC comprising a coarse DAC and a fine DAC. During a loop locking phase for the DCO, the coarse DAC may be set to a fixed value that may be dependent on a target frequency of oscillation for the DCO. After the DCO is locked, the fine DAC may maintain frequency lock over changes in voltage, temperature, etc. The number of bits of the fine DAC may be largely determined by the temperature coefficient of the DCO. A smaller temperature coefficient may be obtained for the DCO with the use of the bias circuit described above. The smaller temperature coefficient may allow for use of a fine DAC having fewer bits, which may result in a smaller circuit area and lower power dissipation for the fine DAC.

In an exemplary design, an apparatus (e.g., a wireless device, an integrated circuit (IC), a circuit module, etc.) may include at least one delay element and a bias circuit, e.g., as shown in FIG. 4A or 4B. The at least one delay element (e.g., delay element 420) may receive a charging current and provide a delay that is dependent on the charging current. The bias circuit (e.g., bias circuit 440 or 442) may control generation of the charging current based on a function of at least one parameter of the at least one delay element in order to reduce variations in the delay of the at least one delay element with temperature (e.g., reduced the delay relative to the case in which the charging current is not generated based on the at least one parameter). The apparatus may further comprise a current source (e.g., iDAC 430 in FIG. 4A or 4B) to provide the charging current for the at least one delay element. The current source may be controlled by the bias circuit.

In one design, each delay element may comprise a current-starved delay element (e.g., delay element 320 in FIG. 3A or delay element 350 in FIG. 3B), which may receive the charging current and provide a delay that is dependent on the charging current. In one design, each delay element may comprise first and second inverters and at least one capacitor. The first inverter (e.g., inverter 330a in FIG. 3A) may be coupled between a common node and circuit ground and may receive a non-inverting input signal and provide an inverting output signal. The second inverter (e.g., inverter 330b in FIG. 3A) may be coupled between the common node and circuit ground and may receive an inverting input signal and provide a non-inverting output signal. The charging current may be applied to the common node. The at least one capacitor may be coupled between the outputs of the first and second inverters. In one design, the at least one capacitor may include (i) a first capacitor (e.g., capacitor 342a) coupled between the output of the first inverter and a control node and (ii) a second capacitor (e.g., capacitor 342b) coupled between the output of the second inverter and the control node. A tuning voltage may be applied to the control node to adjust the capacitance of the first and second capacitors and hence the delay of delay element. The delay element may further comprise a latch (e.g., latch 336 in FIG. 3A) coupled to the outputs of the first and second inverters.

In one design, the at least one parameter of the at least one delay element may comprise a switching threshold voltage of the at least one delay element. The bias circuit may control the generation of the charging current based on a function of the switching threshold voltage, e.g., as shown in equation (2) or (5). The bias circuit may also control the generation of the charging current based on a function the capacitance of the delay element and/or other parameters in order to reduce variations in delay versus temperature.

In one design, the bias circuit may comprise a first transistor, a resistive circuit, and an op-amp. The first transistor (e.g., PMOS transistor 454 in FIG. 4A or 4B) may be coupled in a current mirror with a second transistor (e.g., PMOS transistor 434 in FIG. 4A or 4B) within the current source (e.g., iDAC 430 in FIG. 4A or 4B). One or more additional transistors within the current source may also be coupled in a current mirror with the first transistor (not shown in FIG. 4A or 4B for simplicity). The resistive circuit may be coupled between the first transistor and circuit ground and may comprise a resistor (e.g., resistor 452 in FIG. 4A), a switched-capacitor circuit (e.g., as shown in FIG. 4B), a transistor operating in a linear region, or some other type of resistive circuit. The op-amp may have a first input coupled to the drain of the first transistor, a second input coupled to the drain of the second transistor, and an output coupled to the gates of the first and second transistors. The bias circuit may also be implemented in other manners.

In one design, the at least one delay element may comprise a plurality of delay elements coupled in a loop and implementing an oscillator, e.g., as shown in FIG. 6. The apparatus may comprise an iDAC that provides the charging current for the at least one delay element. The oscillator may be an ICO having a frequency controlled by the charging current from the iDAC. The frequency of the ICO may change little with temperature due to the way in which the charging current is generated. The iDAC and the ICO may be part of a DFLL, e.g., as shown in FIG. 7.

In another design, the at least one delay element may comprise a plurality of delay elements coupled in series and implementing a delay line, e.g., as shown in FIG. 8. The delay line may provide a delay that changes little with temperature due to the way in which the charging current is generated.

In yet another design, the apparatus may implement a temperature sensor comprising first and second delay lines, a detector, and a conversion circuit. The first delay line (e.g., temperature-independent delay line 810 in FIG. 9) may comprise a first plurality of delay elements configured to receive the charging current and provide a first output signal. The first plurality of delay elements may include the at least one delay element. The second delay line (e.g., temperature-dependent delay line 812 in FIG. 9) may comprise a second plurality of delay elements coupled to a power supply voltage and providing a second output signal. The detector (e.g., counter/detector 860 in FIG. 9) may receive the first and second output signals from the first and second delay lines and may provide a detector output indicative of the difference between the delays of the first and second delay lines. The conversion circuit (e.g., look-up table 870 in FIG. 9) may receive the detector output and provide a sensed temperature.

Figure 10:
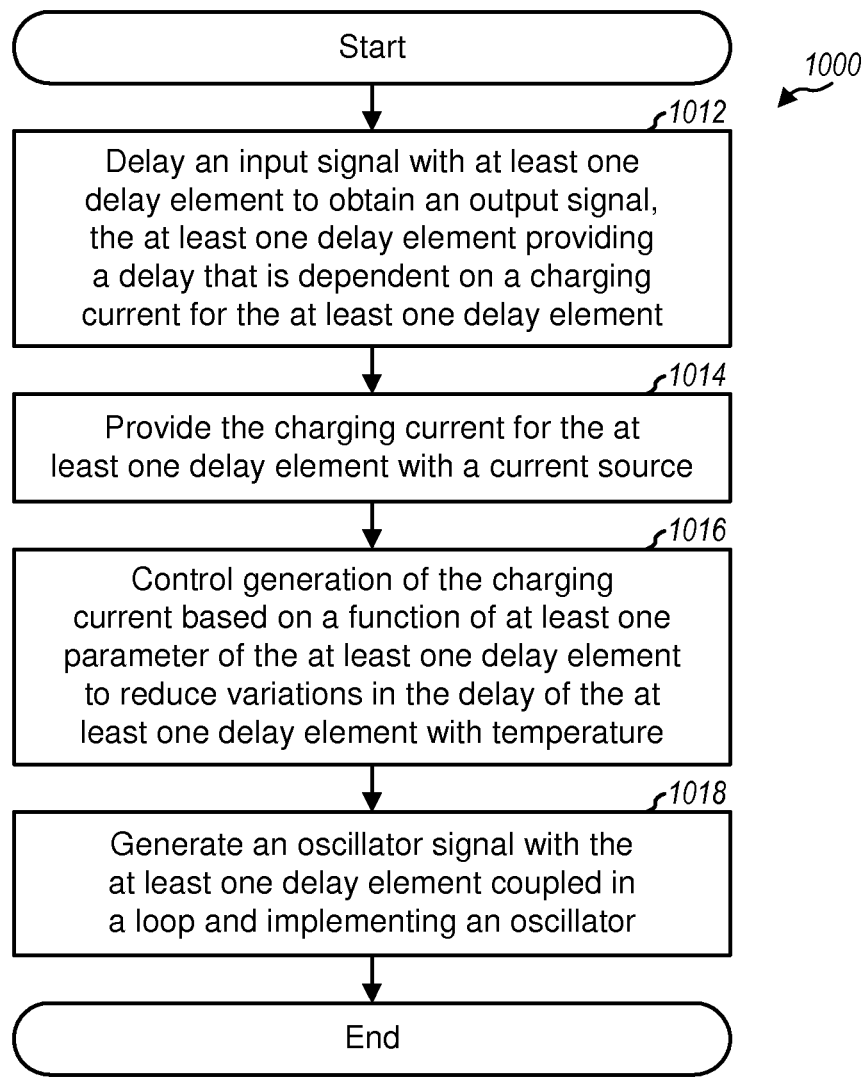
FIG. 10 shows a process for delaying a signal.

FIG. 10 shows a design of a process 1000 for delaying a signal. An input signal may be delayed with at least one delay element to obtain an output signal (block 1012). The at least one delay element may provide a delay that is dependent on a charging current for the at least one delay element. The charging current for the at least one delay element may be provided by a current source, e.g., an iDAC (1014). Generation of the charging current may be controlled based on a function of at least one parameter of the at least one delay element in order to reduce variations in the delay of the at least one delay element with temperature (block 1016). In one design, an oscillator signal may be generated with the at least one delay element coupled in a loop and implementing an oscillator (block 1018). In another design, a delayed signal may be generated with the at least one delay element coupled in series and implementing a delay line.

In one design of block 1016, generation of the charging current may be controlled based on a function of a switching threshold voltage of the at least one delay element. In one design, a first current may be generated based on the switching threshold voltage. The charging current may then be generated by mirroring the first current with a current mirror.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits, and algorithm steps described in connection with the disclosure herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the disclosure herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the disclosure herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein but is to be accorded the widest scope consistent with the principles and novel features disclosed herein.

What is claimed is:

1. An apparatus comprising:
    at least one delay element configured to receive a charging current and to provide a delay that is dependent on the charging current;
    a bias circuit configured to control generation of the charging current based on a function of at least one parameter of the at least one delay element to reduce variations in the delay of the at least one delay element with temperature; and
    wherein each of the at least one delay element comprises a first inverter coupled between a common node and circuit ground and configured to receive a non-inverting input signal and provide an inverting output signal;
    a second inverter coupled between the common node and circuit ground and configured to receive an inverting input signal and provide a non-inverting output signal, wherein the charging current is applied to the common node; and
    at least one capacitor coupled between outputs of the first and second inverters.

2. The apparatus of claim 1, wherein each of the at least one delay element comprises a current-starved delay element configured to receive the charging current and provide a delay that is dependent on the charging current.

3. The apparatus of claim 1, wherein the at least one capacitor comprises
    a first capacitor coupled between an output of the first inverter and a control node, and
    a second capacitor coupled between an output of the second inverter and the control node, wherein a tuning voltage is applied to the control node to adjust capacitance of the first and second capacitors.

4. The apparatus of claim 1, wherein each of the at least one delay element further comprises a latch coupled to the outputs of the first and second inverters.

5. An apparatus comprising:
    at least one delay element configured to receive a charging current and to provide a delay that is dependent on the charging current; and
    a bias circuit configured to control generation of the charging current based on a function of at least one parameter of the at least one delay element to reduce variations in the delay of the at least one delay element with temperature,
    wherein the at least one parameter of the at least one delay element comprises a switching threshold voltage of the at least one delay element, and wherein the bias circuit is configured to control generation of the charging current based on a function of the switching threshold voltage.

6. An apparatus comprising:
    at least one delay element configured to receive a charging current and to provide a delay that is dependent on the charging current;
    a bias circuit configured to control generation of the charging current based on a function of at least one parameter of the at least one delay element to reduce variations in the delay of the at least one delay element with temperature; and
    a current source configured to provide the charging current for the at least one delay element,
    wherein the bias circuit comprises
    a first transistor coupled in a current mirror with a second transistor within the current source,
    a resistive circuit coupled between the first transistor and circuit ground, and
    an operational amplifier (op-amp) having a first input coupled to a drain of the first transistor, a second input coupled to a drain of the second transistor, and an output coupled to gates of the first and second transistors.

7. The apparatus of claim 6, wherein the resistive circuit comprises a resistor or a transistor operating in a linear region.

8. The apparatus of claim 6, wherein the resistive circuit comprises a switched-capacitor circuit.

9. An apparatus comprising:
    at least one delay element configured to receive a charging current and to provide a delay that is dependent on the charging current;
    a bias circuit configured to control generation of the charging current based on a function of at least one parameter of the at least one delay element to reduce variations in the delay of the at least one delay element with temperature; and
    a current digital-to-analog converter (iDAC) configured to provide the charging current for the at least one delay element, wherein the at least one delay element comprises a plurality of delay elements coupled in a loop and implementing a current controlled oscillator (ICO).

10. The apparatus of claim 9, wherein the iDAC and the ICO are part of a digital frequency locked loop (DFLL).

11. An apparatus comprising:
    at least one delay element configured to receive a charging current and to provide a delay that is dependent on the charging current;
    a bias circuit configured to control generation of the charging current based on a function of at least one parameter of the at least one delay element to reduce variations in the delay of the at least one delay element with temperature;
    a first delay line comprising a first plurality of delay elements configured to receive the charging current and provide a first output signal, the first plurality of delay elements including the at least one delay element; and
    a second delay line comprising a second plurality of delay elements coupled to a power supply voltage and providing a second output signal.

12. The apparatus of claim 11, further comprising:
    a detector coupled to the first and second delay lines and configured to receive the first and second output signals from the first and second delay lines and to provide a detector output indicative of a difference between delays of the first and second delay lines.

13. The apparatus of claim 12, further comprising:
    a conversion circuit configured to receive the detector output and provide a sensed temperature.

14. A method of delaying a signal, comprising:
    delaying an input signal with at least one delay element to obtain an output signal, the at least one delay element providing a delay that is dependent on a charging current for the at least one delay element; and
    controlling generation of the charging current based on a function of at least one parameter of the at least one delay element to reduce variations in the delay of the at least one delay element with temperature,
    wherein the controlling generation of the charging current comprises controlling generation of the charging current based on a function of a switching threshold voltage of the at least one delay element.

15. An apparatus comprising:
    means for delaying an input signal to obtain an output signal, the means for delaying providing a delay that is dependent on a charging current for the means for delaying; and
    means for controlling generation of the charging current based on a function of at least one parameter of the means for delaying to reduce variations in the delay of the means for delaying with temperature,
    wherein the means for controlling generation of the charging current comprises means for controlling generation of the charging current based on a function of a switching threshold voltage of the means for delaying.

16. The apparatus of claim 15, wherein the means for controlling generation of the charging current comprises
    means for generating a first current based on the switching threshold voltage, and
    means for generating the charging current by mirroring the first current.

* * * * *